United States Patent [19]
Eng et al.

[11] Patent Number: 5,882,986
[45] Date of Patent: Mar. 16, 1999

[54] SEMICONDUCTOR CHIPS HAVING A MESA STRUCTURE PROVIDED BY SAWING

[75] Inventors: Jack Eng, Bellmore; Joseph Y. Chan, Kings Park, both of N.Y.; Willem G. Einthoven, Somerset, N.J.; John E. Amato, Taipei, Taiwan; Sandy Tan, Farmingdale, N.Y.; Lawrence LaTerza, Miller Pl., N.Y.; Gregory Zakaluk, Seaford, N.Y.; Dennis Garbis, South Huntington, N.Y.

[73] Assignee: General Semiconductor, Inc., Melville, N.Y.

[21] Appl. No.: 50,106

[22] Filed: Mar. 30, 1998

[51] Int. Cl.⁶ .............................. H01L 21/30; H01L 21/46
[52] U.S. Cl. ........................... 438/456; 438/455; 438/460
[58] Field of Search ..................................... 438/456, 455, 438/460

[56] References Cited

U.S. PATENT DOCUMENTS

| | | |
|---|---|---|
| 5,489,554 | 2/1996 | Gates ....................................... 438/455 |
| 5,723,360 | 3/1998 | Iwasaki . |
| 5,759,753 | 6/1998 | Namba et al. .......................... 438/456 |
| 5,759,872 | 6/1998 | Van Roijen et al. . |
| 5,760,482 | 6/1998 | Van Aken . |

*Primary Examiner*—Kevin M. Picardat
*Assistant Examiner*—Devon Collins

[57] ABSTRACT

Starting with a semiconductor wafer of known type including an internal, planar p-n junction parallel to major surfaces of the wafer, one of the wafer surfaces is covered with a masking layer of silicon nitride. A plurality of intersecting grooves are then sawed through the masking layer for forming a plurality of mesas having sloped walls with each mesa including a portion of the planar p-n junction having edges which intersect and are exposed by the mesa walls. The groove walls and exposed junction edges are glass encapsulated in a process including heating the wafer. The masking layers are then removed in a selective etching process not requiring a patterned etchant mask, and the now exposed silicon surfaces at the top of the mesas, as well as the opposite surface of the wafer, are metal plated. The wafer is then diced along planes through the grooves for providing individual chips each having a glass passivated mesa thereon.

9 Claims, 3 Drawing Sheets

SEMICONDUCTOR CHIPS HAVING A MESA STRUCTURE PROVIDED BY SAWING

BACKGROUND OF THE INVENTION

This invention relates to semiconductor chips having a mesa structure, and particularly to the manufacture of such chips using a mechanical sawing process.

It is known to provide semiconductor chips, particularly for rectifier devices, in the form of a generally flat semiconductor substrate having a mesa extending upwardly from the substrate. A p-n junction within the mesa intercepts the sloped walls of the mesa, with the result being that electric fields adjoining the p-n junction have lower strengths at the mesa surfaces than within the mesa. Thus, upon conditions giving rise to voltage breakdown of the device, the breakdown occurs within the mesa rather than along the mesa surfaces. As known, such internal breakdowns are much less destructive than breakdowns along the surfaces, and, by avoiding surface breakdowns, the device can withstand much higher energy pulses before being destroyed.

The theory concerning surface voltage breakdown was perhaps first described and analyzed by R. L. Davies and F. E. Gentry in "Control of Electric Field at the Surface of P-N Junctions", IEEE Transactions on Electron Devices, July, 1964, pp. 313–323. In the devices experimented with by the authors, sloped mesa walls were obtained by grinding. More typically, in recent times, sloped mesas are obtained by anisotropical etching, as described, for example, in U.S. Pat. Nos. 4,740,477, 4,891,685, 5,010,023 and 5,399,901, all issued to W. G. Einthoven et al. (The subject matter of these patents is incorporated herein by reference.) Such anisotropical etching processes comprise providing a silicon wafer coated with a masking layer of silicon nitride, applying a photoresist layer over the masking layer, and forming a mesa defining pattern in the photoresist using a photomask. Etching is then performed through the patterned photoresist layer and into the underlying masking layer and wafer for defining a plurality of mesas on the wafer surface. Having defined the mesas, subsequent processing steps can be performed for further defining the parameters of each mesa containing chip to be formed. Then, the mesa side walls are oxidized for passivating the mesa wall surfaces. The masking layers overlying the mesas are removed (typically in a photolithographic process using a photomask) for exposing silicon surfaces at the mesa tops, the exposed surfaces and wafer bottom surface are metal plated for forming chip electrodes, and the thus basically completed chip structures are separated in a wafer-dicing operation, e.g., by mechanical sawing.

While the foregoing described process is quite satisfactory and is extensively used, the process is relatively expensive owing to the need for relatively complicated processes, e.g., the preparation and use of photomasks in the process, and the costs of the materials used. The question was thus raised by the inventors herein whether less expensive mesa shaping processes could be used. Mechanical sawing, already known for dicing the substantially completed wafer, was considered for the earlier step of forming the mesas and, as hereinafter described, was adopted as part of a chip fabricating process.

As just noted, mechanical sawing for dicing wafers is known. Also, while such sawing is typically done only after substantially all the processing required for the individual chips is completed, there are instances where the sawing process used to dice the wafer into chips is also used to shape and passivate the sides of each chip.

In the U.S. Pat. No. 4,904,610, to Shyr, for example, it is explained (at column 4, lines 23 and 24) that the wafer dicing, performed by sawing, results in "a beveled groove" (the groove being sawed entirely through the wafer and thus shaping the sides of each chip) "yielding a high breakdown voltage for a rectifier or other end product."

More specifically, in the process shown in the Shyr patent, a silicon semiconductor wafer, substantially completely processed and including metal electrodes on opposite major surfaces, is adhered, via a wax layer, to a rigid support substrate. A plurality of orthogonal grooves having sloped side surfaces are then sawed entirely through the thickness of the wafer and partly into the underlying wax layer. An etching process is used to smooth the groove sawed surfaces, and a silicon resin is then deposited onto the grooved surface of the wafer for filling in the grooves. The resin, after curing, adheres strongly to the groove walls but only poorly to the metal plated surface of the wafer. The resin is then readily removed, as by buffing, from the wafer plated surface without removal of the resin from within the grooves. The wafer is then separated from the supporting substrate. Although the wafer has been sawed through into separate chips, the chips remain attached to one another by the cured resin between and attached to the chips. Solder is then selectively applied to the surfaces of the metal electrodes on the chips, and the chips are finally separated by slicing through the resin layers between the chips. The side surfaces of the chips remain coated with the cured resin which serves to passivate the chip sides.

Now, while the Shyr process does result in chips having passivated, sloped side surfaces for high voltage breakdown characteristics, the Shyr process is basically a variation on known wafer dicing processes typically performed after all the basic processing of the precursor chips has been completed. Specifically, at the stage of wafer production when the Shyr dicing process is performed, all high temperature processing of the precursor chips has been completed and further high temperature processing is avoided. Thus, in the Shyr process, the metal electrodes (preferably provided in a high temperature processing step, i.e., in excess of 400° C.) are already present, and the chip passivating material used, i.e., the disclosed silicone resin, is applied and cured at lower temperatures, e.g., around 200° C.

Conversely, as above-explained, and as described hereinafter, the present invention involves the use of mechanical sawing as a direct substitution for the previously used anisotropic etching process and at a relatively early part of the chip fabrication schedule. Nothing in Shyr shows nor suggests such direct substitution or how it could be accomplished.

The use of "mechanical cutting" for forming mesas is also disclosed in the afore-cited U.S. Pat. Nos. 4,740,477 and 4,891,685 to Einthoven (an inventor herein). However, to the knowledge of the inventors herein, all devices made in accordance with these patents employ anisotropic etching for forming the mesas. "Mechanical cutting", i.e., sawing, has never actually been used nor considered in detail until the making of the present invention. Also, such "actual" devices are made using photolithographic processes both for forming the mesas and for providing metal electrodes on the tops of the mesas. Such photolithographic processes are expensive to perform. As described hereinafter, the present invention provides for formation of the mesas, the passivation of the mesa side walls, and the metallizing of the mesa top surfaces all without the use of photolithographic processes.

SUMMARY OF THE INVENTION

A method of making semiconductor chips comprises providing a semiconductor wafer of known type heretofore used for fabricating chips having mesa structures. The wafer includes a p-n junction lying in a surface parallel to major surfaces of the wafer, and the upper surface of the semiconductor material of the wafer is covered with a masking layer, preferably of silicon nitride. Spaced apart mesas are then formed in an upper portion of the wafer by sawing a plurality of intersecting grooves into the wafer through the masking layer. The sawed grooves have sloped walls and have a depth (which can be reached after a subsequent etching process for smoothing the sawed surfaces of the wafer) for intersecting and exposing edges of the junctions at the mesa side walls. A passivating material, preferably glass, is disposed within the grooves and heated for glass encapsulating the mesa walls. During the glass encapsulating process, the masking layers of silicon nitride at the top of each mesa protect the underlying semiconductor material against oxidation and against contacting by the passivation glass. The masking layers are then removed (by etching, and without use of a photomask) for exposing the underlying mesa semiconductor material. The thus exposed mesa top surfaces and the bottom of the wafer are then metalized to substantially complete the processing of the wafer which is then diced into separate mesa containing chips, e.g., by mechanical sawing.

DESCRIPTION OF THE DRAWING

The drawings are schematic and not to scale.

FIG. 6 showing, and only FIG. 6, an example of a passivating layer non-selectively deposited on an entire surface of the wafer).

DESCRIPTION OF PREFERRED
EMBODIMENTS OF THE INVENTION

Figure 1:
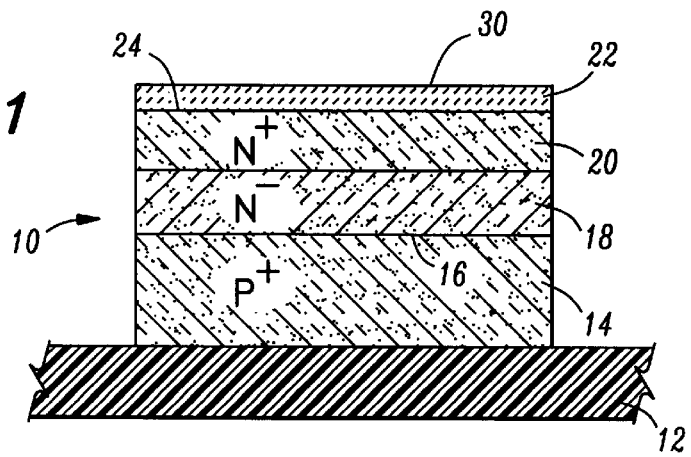
FIG. 1 is a side elevational view of a semiconductor wafer in accordance with this invention; the wafer being shown adhered to an underlying supporting tape.

A semiconductor wafer 10, preferably of silicon, is shown in FIG. 1 mounted on a support structure, e.g., a sheet of adhesive tape 12. (Alternatively, the wafer can be mounted on a known vacuum chuck.) The tape 12 serves to support the wafer while it is being grooved by sawing, as shortly described. The sawing of wafers (typically for dicing them), and the use of tapes in the sawing process, are known.

Except as hereinafter described, the wafer 10 can be identical to known wafers used for fabricating chips for use in semiconductor devices such as discrete rectifiers, $TVS_s$ (transient voltage suppressors), transistors, certain types of thyristors, and the like.

By way of example, the wafer 10, in this embodiment, includes a bottom $p^+$ layer 14 forming a planar p-n junction 16 with an overlying $n^-$ layer 18 overlaid, in turn, with an $n^+$ layer 20. (By "planar junction" is simply meant a junction lying in a plane; the term "planar" not referring to the known "planar junction process.")

The bottom layer 14 can be formed as a discrete substrate, and the layers 18 and 20 sequentially epitaxially grown thereon. Alternatively, the top layer 20 can be formed by diffusion of n-type dopants into the epitaxially grown $n^-$ layer 18. Alternatively still, an $n^-$ discrete layer 18 substrate can be n-doped through one side to form the upper $n^+$ layer 20 and p-doped through the other side to form the bottom $p^+$ layer 14.

The upper surface 24 of the layer 20 (forming the upper surface of the silicon wafer 10) is covered with a masking layer 22. The masking layer is used, as hereinafter described, for allowing localized etching and high temperature processing of the wafer and for preventing contamination of the top surfaces of the layers 20 in the mesas to be formed. A preferred material for the layer 22 is silicon nitride, at least partially because silicon nitride is selectively etchable relative to glass passivating layers later provided. The use of silicon nitride masking layers in the fabrication of semiconductor devices is known.

Figure 2:
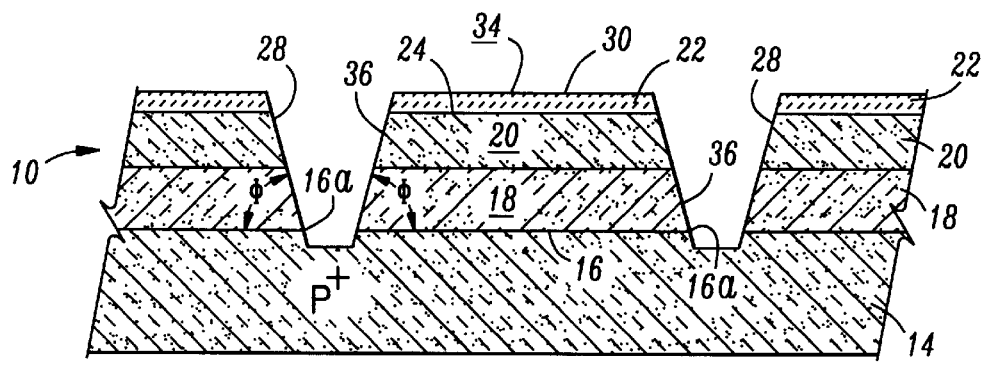
FIG. 2 shows, on an enlarged scale, a portion of the wafer shown in FIG. 1 after grooves have been sawed into the wafer, the tape shown in FIG. 1 removed, and the wafer chemically etched to smoothen the groove walls.
Figure 3:
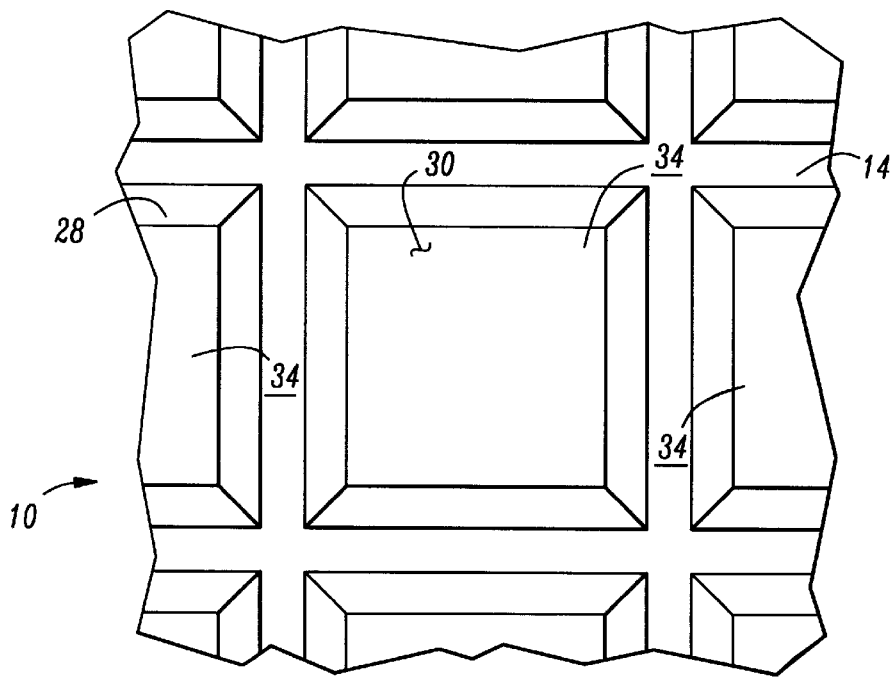
FIG. 3 is a plan view of the wafer portion shown in FIG. 2.

Then, as shown in FIGS. 2 and 3 (showing only a small portion of the wafer 10 shown in FIG. 1), a plurality of orthogonal grooves 28 are provided in the upper portion of the wafer. The grooves 28 do not extend entirely through the wafer 10 but sub-divide the wafer into a plurality of identical mesas 34 (only one complete mesa being shown in FIGS. 2 and 3) extending upwardly from a common underlying substrate 14.

The mesas 34 have a square cross-sectional shape increasing in area from the top surface 30 of the silicon nitride layer 22 at the top of each mesa downwardly to the substrate 14. In this embodiment, the mesa side walls 36 are straight and uniformly sloped. Each mesa includes a portion of the planar p-n junction 16 originally present in the wafer 10, and the edges 16a of each mesa junction are exposed at the mesa side walls 36. As known, and as discussed in the afore-cited article to Davies and Gentry, the intersections of the mesa p-n junctions with the mesa sloped walls provide a desired voltage breakdown characteristic of the semiconductor chips.

Figure 4:
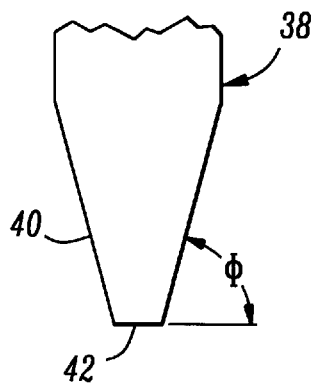
FIG. 4 is a front view of the edge of a blade used for sawing the grooves shown in FIGS. 2 and 3.

In accordance with this invention, the orthogonal grooves 28 in the wafer 10 are provided by sawing using, for example, a disc saw 38 (FIG. 4) having a diamond blade. The cutting edge of the blade is beveled at a preselected angle Ø and the blade sloped sides 40 are joined by a flat side 42. The grooves 28 (FIG. 2) sawed into the wafer 10 correspond in shape exactly to that of the blade edge. The sawing of silicon wafers (typically, as earlier noted, for wafer dicing) is known, and diamond blades having selected shapes and dimensions are commercially available on a customized basis. Typically, the blade bevel angle Ø (and the corresponding groove wall bevel angle Ø) is between 30–75 degrees. Also, blades having curved side walls can be used to provide grooves having curved walls.

The selection of the desired groove wall slope and shape is in accordance with known technology and is dependent upon the material used for passivation and the ratings of the particular semiconductor devices later to incorporate chips made according to the present invention.

Although a relatively large number of grooves 28 are sawed into each wafer 10 (e.g., 40 by 40 grooves in a 100 mm diameter wafer), it is found preferable to make but one cut at a time using a single blade. Plural cuts can be simultaneously made using ganged blades but, generally, excessive dimensional variations result.

As mentioned, the planar p-n junction 16 within each mesa 34 must intersect the mesa walls 36. The mesa forming grooves 28 thus must be deep enough to intersect the planar p-n junction 16 present in the starting wafer 10, and must extend slightly below the exposed p-n junction edges 16a. As known (per the afore-cited article) the groove depth beyond the p-n junction 16 must be at least comparable to the maximum width of the depletion region spreading downwardly from the p-n junction 16 at voltage breakdown conditions. Because of the relatively high conductivity of the p$^+$ layer 14, only a relatively small spreading of the depletion region occurs within the layer 14. Thus, in general, the depth of the grooves 28 need be only slightly greater than the depth of the p-n junction 16 within each mesa. Such depth is a function of the particular semiconductor device to be made.

By way of example, the p-n junction 16 (of the wafer shown in FIG. 1) is from 4–7 mils beneath the wafer top surface 30, and the depth of the grooves, as initially formed by sawing, is about equal to the depth of the p-n junction 16. The final depth of the grooves (as illustrated in FIG. 2) is determined by an etching process next performed to smoothen the groove walls formed in the sawing process.

Etch smoothing of silicon surfaces is known and described, for example, in the afore-cited patent to Shyr. Herein, the preferred etching solution comprises nitric, acetic and hydrofluoric acids in the ratio of 3:1:1. The etching is performed at a temperature of 8°–12° C. with an immersion time of around 30–60 seconds. By way of specific example, with a p-n junction 16 depth of 4 mils, the grooves 28 are sawed to a depth of 4.5 mils, and reach a final depth (FIG. 2) of 5 mils after etching. (FIG. 2 shows the wafer 10 after the etching step. The tape 12 shown in FIG. 1 is present during sawing of the wafer but is removed prior to the etching.)

Of significance, neither the sawing process nor the etch smoothing process affects the remaining portions of the layer 22 of silicon nitride present on each mesa. The silicon nitride layers 22 are compatible with high temperature processes to be performed. One such high temperature process is now described.

Figure 5:
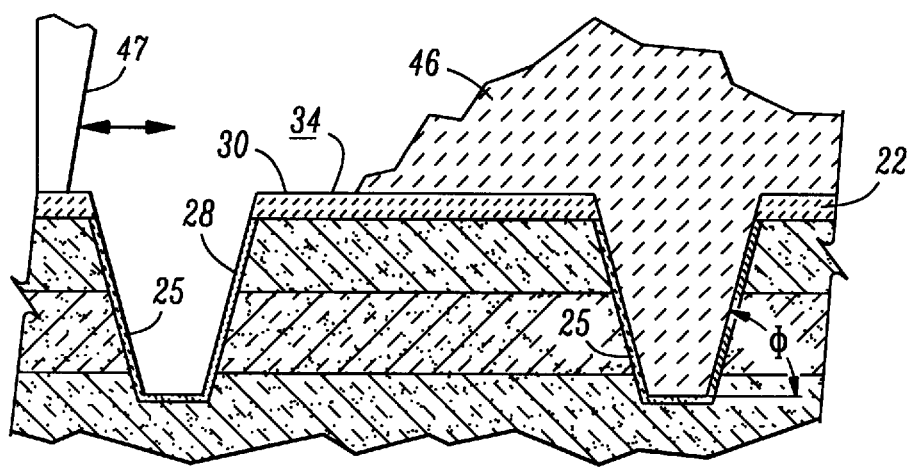
FIGS. 5–8 are views similar to FIG. 2 but showing the wafer portion at successive processing steps in accordance with different aspects of this invention (FIG. 5 showing, and only FIG. 5, an example of a thermally, selectively grown passivating layer.

As previously described, the edge 16a of the p-n junction 16 in each mesa 34 is exposed at the mesa side wall 36, and it is necessary that the mesa side walls 36 be encased within a suitable "passivating" material. The use of passivating layers is well known in semiconductor devices, and, typically, silicon dioxide passivating layers are thermally grown on the mesa walls. In accordance with the present invention, however, a passivating material is selected for the purpose, as hereinafter described, of avoiding the need for the use of photomasks in subsequent processes to be performed. Preferably, the passivating material used is a relatively thick (as hereinafter discussed) layer of a known glass typically used for encapsulation purposes in semiconductor devices, e.g., a zinc (or lead)-boro-silicate glass. Most conveniently, a slurry 46 (FIG. 5) of particles of the selected glass is disposed onto the grooved surface 30 of the wafer and then doctor bladed (e.g., by a squeegee 47) across the surface for forcing the slurry into the grooves while simultaneously wiping substantially all the slurry off the flat portions 30 of the wafer surface between the grooves.

Other methods for applying the glass layer to the workpiece comprise electrophoresis and screen printing. Using electrophoresis, the glass is selectively deposited only on electrically conductive surfaces; thus only on the silicon mesa side surfaces 36, and not on the silicon nitride layers 22 covering the mesa tops.

Figure 6:
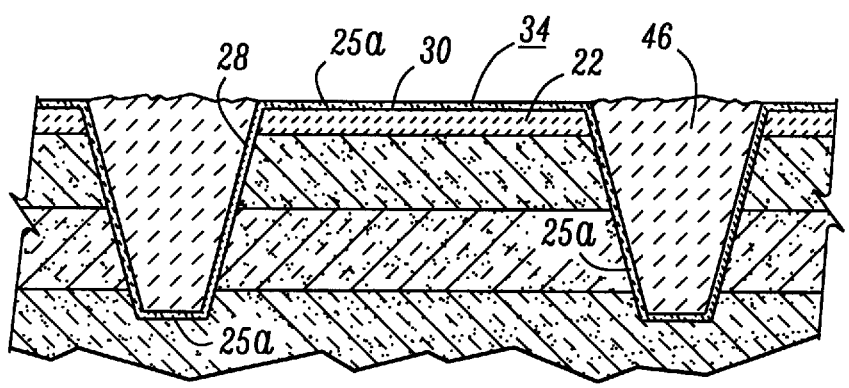

As shown in FIG. 6, when the glass slurry is first spread (and removed from the mesa top surfaces), the glass slurry 46 substantially fills the grooves 28. Then, the glass is vitrified into a smooth encapsulating layer by a known firing process, e.g., slowly heating the workpiece to a temperature around 830° C., where melting and flowing occurs, followed by an even slower cooling of the glass layer for annealing the glass.

Figure 7:
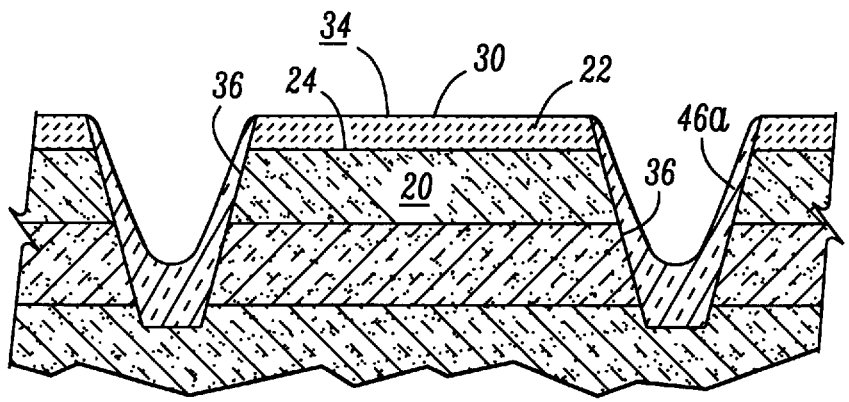

The vitrified glass layer 46a is shown in FIG. 7. The vitrified glass is compacted and hermetically encapsulates the mesa side walls 36. The thickness of the glass layer 46a varies, as shown, but the minimum thickness of the layer 46a (excluding edge regions close to the mesa top surfaces 24) is around 50,000 Angstroms, which is significantly greater than the thickness, e.g., around 2,000 Angstroms, of the layer 22 of silicon nitride on each mesa. (Also, the minimum glass layer thickness is significantly greater than that of any other optional layers of passivating materials (described hereinafter) non-selectively deposited onto the wafer.)

Of importance is that glass is a preferred passivating material (superior, for example, to the silicone resin passivating material used in the process disclosed in the afore-cited Shyr patent), and that proper application of the glass includes heating the workpiece to the afore-described 830° C. Such heating of the workpiece is made practical by the presence of the silicon nitride layers 22 which, during the glass firing, prevent contamination or oxidation of the top surfaces 24 of the n$^+$ silicon layer 20 overlaid by the silicon nitride layers 22.

With the silicon nitride layers 22 present, still other high temperature processes can be performed depending upon the particular chip being fabricated. For example, selective oxidation of the groove walls can be performed prior to glassing, e.g., in a steam atmosphere at 1100° C., for improved passivation. The passivation material thus comprises a layer 25 (shown in FIG. 5 by way of example but not in other figures) of silicon dioxide (having a thickness, not critical, e.g., from 5,000–20,000 Angstroms) covered by a layer of glass. Also, and again prior to the glassing, additional dopants can be added to and diffused within the mesas.

In the instance, just described, in which a layer of silicon dioxide is thermally grown on the silicon mesa side walls, glass deposition by electrophoresis is not possible, and the preferred process is the afore-described slurry deposition-doctor blading process.

Instead of providing a thermally grown oxide layer on the groove walls 36, other materials can be used either alone or in various combinations. Thus, and prior to the glassing process, a layer 25a (shown in FIG. 6 by way of example but not in other figures) of silicon dioxide can be directly deposited onto the entire grooved surface of the wafer by the known "low temperature oxide" process; or, in similar known deposition processes, deposited at relatively high temperatures. The deposited oxide layer serves to passivate the silicon side walls 36 of the mesas either directly or in combination with a previously provided passivating material, e.g., the afore-described thermally grown oxide.

The deposited oxide also covers the silicon nitride layers 22 on the mesa tops, but the layers 22 prevent contact of the deposited oxide layer with the silicon surfaces 24 of the mesas underlying the nitride layers 22.

Other passivating materials are polycrystalline silicon and silicon nitride. Techniques for depositing these materials onto a substrate are known.

As described, the glass layer 46a (FIG. 7) is then provided in a process leaving the mesa tops not covered by the glass layer. Thus, in those instances when a passivating material layer has been deposited onto the entire wafer (e.g., the deposited materials silicon dioxide, polycrystalline silicon and/or silicon nitride), such deposited passivating material remains exposed on top of the silicon nitride layers 22. Because these materials are later to be removed, along with the silicon nitride layers 22 (as now to be described), it is preferred that any such deposited layers be relatively thin, e.g., around 300–500 Angstroms, in comparison to the much thicker layer 46a of glass (e.g., having the aforementioned minimum thickness of around 50,000 Angstroms).

At the conclusion of one or more of the foregoing processing steps, and after the glassing process, the silicon nitride layers 22, and any covering layers, are removed. If the silicon nitride layers 22 are not covered, the layers 22 can be removed in a silicon nitride selective etchant such as phosphoric acid which only weakly etches silicon dioxide and glass.

A preferred process for removing the silicon nitride layers 22 including any layers thereon, is a plasma etching process which effectively removes all the exposed surface materials (i.e., the glass layer 46a, the silicon nitride layers 22 and/or the optionally deposited silicon dioxide, polycrystalline silicon and silicon nitride passivating layers) but at a carefully controlled rate. Thus, in the plasma etching process, when the mesa covering silicon nitride layers 22 are just removed (along with any covering deposited layers), along with an equal thickness of the glass layer 46a, the process is immediately stopped (making use of known plasma composition monitoring). Because the glass layer minimum thickness is significantly greater than the thickness of the removed silicon nitride layers (plus any covering deposited passivating layers), the remaining thickness of the glass layers 46a (plus any underlying passivating layers) is still adequate for effective passivation of the mesa sloped walls. (FIG. 8 shows the wafer 10 without the silicon nitride layers 22.)

Removal of the silicon nitride layers 22 is needed for allowing later metal plating of electrodes (shown in FIG. 8 as layer 50) onto the $n^+$ layer 20 of the mesas. Significantly, however, the combination of a glass passivation layer 46a and the mesa covering layers of silicon nitride (and any deposited passivating layers) allows a selective etch removal of the layers covering the mesas, but without the need for a photolithographic etching process. That is, as described, selectively is automatically obtained by the choice of materials and the relative thicknesses of the passivation and masking layers. By avoiding the use of photolithographic process, a significant cost savings over the prior art processes is obtained.

With the removal of the silicon nitride layers 22 and the exposure of the $n^+$ layers 20, which now form the mesa tops, the wafer is basically ready for metalization. That is, because the silicon nitride layers 22 prevented oxidation or other contamination of the upper surfaces 24 of the silicon layers 20, upon removal of the silicon nitride layers 22, as described, the uncovered silicon surfaces 24 are sufficiently clean (after a brief dip in a weak HF etchant to remove any "native oxide" on the surfaces 24) for the performance of the metalizing process. The glass layers 46a within the grooves 28 are electrically non-conductive, and using known electroless processes, various layers 50 (FIG. 8) of metal, e.g., of nickel and gold, are selectively plated onto the mesa silicon surfaces 24 and the bottom surface 14a of the wafer. Typically, a layer of nickel is electrolessly plated onto the silicon surfaces and then sintered to form a nickel silicide. The silicide surface is then cleaned, and a further layer of nickel is added, followed by a flash of gold.

Figure 8:
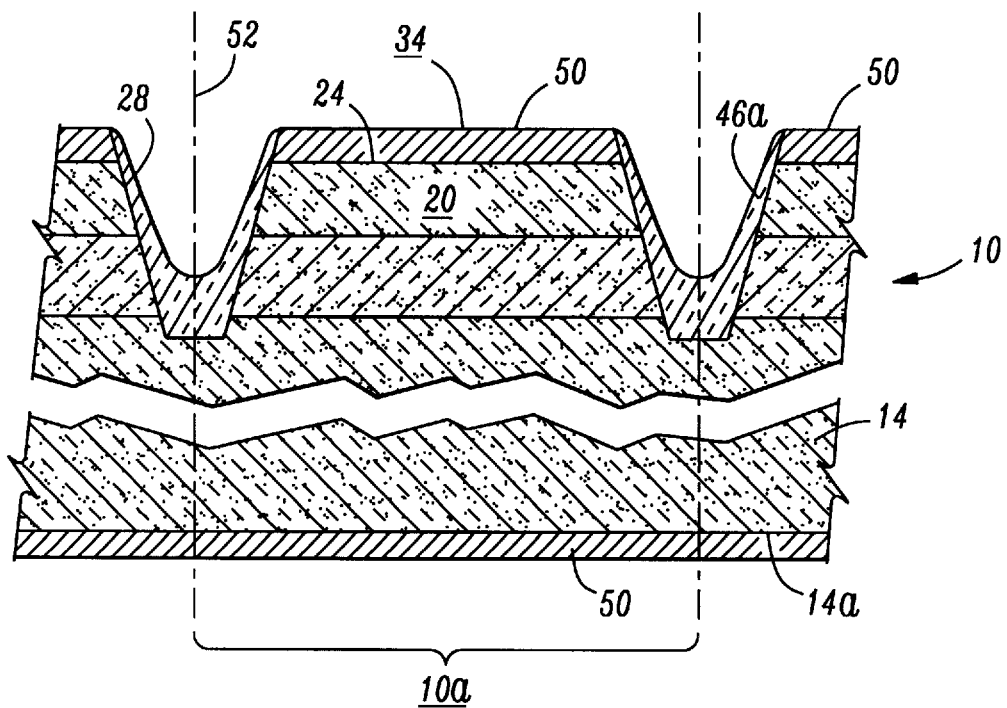

A portion of the thus completed wafer is shown in FIG. 8. Individual chips 10a, each for inclusion in a discrete semiconductor device, are obtained by dicing the wafer, as by sawing vertically through the grooves 28 along the dash line 52 shown in FIG. 8. Although the glass layers 46a surrounding each mesa 34 are thus sliced through, the glass layers do not crack but remain firmly adhered to the mesa side walls.

At this stage of fabrication, the separated chips 10a are substantially identical to chips having mesas formed by known etching processes. Thus, further processing of the chips for eventual fabrication of semiconductor devices can be in accordance with known procedures which are not herein described.

In summary, a significant advantage of the invention is that semiconductor wafers can be processed into devices entirely without the need for photolithographic processes, i.e., without the need for photoresist layers and corresponding photomasks for patterning first the photoresist layers followed by selective etching through the patterned layers. The various mesas are formed by mechanical sawing (followed, for smoothening and deepening functions, by an etching process not attacking the mesa silicon top surface 24 owing to the covering layers 22 of silicon nitride), and the steps of readying the mesa silicon surfaces for, and metal plating the mesa silicon surfaces, are likewise performed by "selective" processes not requiring photolithographic processes.

Of course, where the invention is used to make somewhat more complicated devices including dopings of selected portions of the wafer, photolithographic processes might be required. Still, as herein described, the processes of mesa formation, mesa passivation, and mesa metal plating are done without photolithographic processes.

What is claimed is:

1. A method of fabricating a semiconductor chip having a mesa structure comprising the steps of providing a wafer of silicon having therein a planar p-n junction parallel to first and second surfaces of the wafer, covering said first surface with a silicon nitride masking layer, forming a mesa having sloped walls intersecting said p-n junction by sawing grooves into and only partially through said wafer, encapsulating said mesa sloped walls and the portions of the p-n junction intercepted by said walls with a layer of a glass first passivating material, thereafter removing said masking layer for exposing said wafer first surface as a top surface of said mesa while leaving at least portions of said glass layer in place, and then metal plating said mesa top surface and said wafer second surface.

2. A method according to claim 1 wherein said removing step is performed by selective etching said silicon nitride layer by an etchant relatively ineffective against said glass layer and said silicon wafer.

3. A method according to claim 1 including providing said glass layer with a thickness, at least along said portions thereof, substantially greater than that of said silicon nitride layers, and wherein said removing step comprises simultaneously plasma etching both said layers for removing the entire thickness of said silicon nitride layer while removing only part of the thickness of said glass layer portions.

4. A method according to claim 1 including, subsequent to said sawing step and prior to said encapsulating step, etching surfaces of said grooves for smoothing said groove surfaces and for increasing the sawed depth of said grooves.

5. A method according to claim 4 wherein said planar p-n junction is at a first distance from said first surface of said wafer, said grooves are sawed to a depth generally equal to said first distance from said first surface, and wherein said groove etching step extends the depth of said grooves to a distance beyond said p-n junction at least equal to the maximum width of a depletion layer spreading from said p-n junction during conditions of electrical operation of said chip within a semiconductor device leading to a voltage breakdown at said p-n junction.

6. A method according to claim 4 including the steps of providing a plurality of identical mesas on said wafer by said wafer sawing step, identically processing all of said mesas, and dicing said wafer along planes perpendicular to said wafer first and second surfaces and through bottom surfaces of said grooves for providing individual semiconductor chips.

7. A method according to claim 1 including, prior to said encapsulating step, thermally growing a layer of silicon dioxide on said mesa sloped walls.

8. A method according to claim 4 wherein said encapsulating step comprises dispensing a glass slurry onto said masking layer after said groove sawing step, and doctor blading said slurry across the surface of said masking layer for forcing the slurry into said grooves while simultaneously substantially completely removing the slurry from said masking layer.

9. A method according to claim 4 including, prior to said encapsulating step, depositing a second passivating material layer onto the grooved surface of said wafer for covering said mesa sloped walls and said masking layer with said second passivating layer, and wherein said encapsulating step comprises selectively covering said second passivating layer where it covers said mesa sloped walls with said glass layer, said glass layer including portions having a thickness greater than the combined thickness of said masking layer and said covering second passivating material layer, and wherein said removing step comprises plasma etching the grooved surface of the wafer for removing the combined thickness of said masking layer and covering second passivating material layer while removing only part of the thickness of said glass layer portions.

* * * * *